(12) United States Patent
Finch et al.

(10) Patent No.: US 8,766,710 B1
(45) Date of Patent: Jul. 1, 2014

(54) INTEGRATED CIRCUIT

(75) Inventors: Simon Finch, Newmarket (GB); Alan Coombs, Haddenham (GB)

(73) Assignee: Cambridge Silicon Radio Limited, Cambridge (GB)

( * ) Notice: Subject to any disclaimer, the term of this patent is extended or adjusted under 35 U.S.C. 154(b) by 11 days.

(21) Appl. No.: 13/572,592

(22) Filed: Aug. 10, 2012

(51) Int. Cl.
*G05F 1/10* (2006.01)

(52) U.S. Cl.
USPC .......................................................... 327/544

(58) Field of Classification Search
USPC ......................................... 327/530, 544, 564
See application file for complete search history.

(56) References Cited

U.S. PATENT DOCUMENTS

| | | | | |
|---|---|---|---|---|
| 6,804,632 | B2 * | 10/2004 | Orenstien et al. | 702/188 |
| 7,461,275 | B2 * | 12/2008 | Belmont et al. | 713/300 |
| 7,702,938 | B2 * | 4/2010 | Ha | 713/323 |
| 8,484,488 | B2 * | 7/2013 | Belmont et al. | 713/300 |
| 2007/0083785 | A1 * | 4/2007 | Sutardja | 713/323 |
| 2008/0263324 | A1 * | 10/2008 | Sutardja et al. | 712/43 |
| 2009/0222654 | A1 * | 9/2009 | Hum et al. | 713/100 |
| 2009/0309243 | A1 | 12/2009 | Carmack et al. | |
| 2013/0198544 | A1 * | 8/2013 | JU et al. | 713/323 |

OTHER PUBLICATIONS

"Variable SMP—A Multi-Core CPU Architecture for Low Power and High Performance", NVIDIA Coporation, 2011, pp. 1-16.

* cited by examiner

*Primary Examiner* — Jeffrey Zweizig
(74) *Attorney, Agent, or Firm* — Pillsbury Winthrop Shaw Pittman LLP

(57) ABSTRACT

An integrated circuit comprising: a first core circuit configured to operate at a first clock rate for carrying out a first range of tasks; and a second core circuit configured to operate in a first mode and a second mode, the second core circuit being configured to operate at a second clock rate for carrying out a second range of tasks in the second mode and being configured to operate in the second mode when the first core circuit carries out the first range of tasks, the second clock rate being greater than the first clock rate.

18 Claims, 2 Drawing Sheets

INTEGRATED CIRCUIT

FIELD OF THE INVENTION

The present invention relates to integrated circuits, more particularly integrated circuits comprising multiple processing cores.

BACKGROUND OF THE INVENTION

Integrated circuits (IC) typically include numerous passive and active components manufactured on a substrate material. Conventional ICs may include hundreds, thousands, millions or more semiconductor devices. As semiconductor technology has progressed, ICs have provided ever increasing performance. Furthermore, as semiconductor technology has progressed, it has generally been possible to decrease power consumption for the same level of performance. However, the increase in performance generally causes the power consumption in the IC to increase faster than technological improvements in decreasing power consumption. In addition, ICs may only operate at maximum performance a fraction of the time.

A number of techniques have been developed to increase performance and reduce power consumption. For example, sleep and standby modes, multithreading, multi-core and other techniques are currently employed to increase performance and/or decrease power consumption. Generally, techniques for reducing power or increasing performance are particularly suited for a given processing task. Therefore, one of the biggest challenges in designing high performance IC, such as microprocessors, is trading off high performance and low power operations required for different tasks. Low power consumption can be partially important in the case of portable devices with a finite amount of power provided by its battery. By reducing the power consumption of such devices, it is possible to extend the battery lifetime of the device.

Accordingly, there is a need to improve the trade off between high performance and low power operations of ICs.

SUMMARY OF THE INVENTION

According to a first aspect of the disclosure there is provided an integrated circuit comprising: a first core circuit configured to operate at a first clock rate for carrying out a first range of tasks; and a second core circuit configured to operate in a first mode and a second mode, the second core circuit being configured to operate at a second clock rate for carrying out a second range of tasks in the second mode and being configured to operate in the second mode when the first core circuit carries out the first range of tasks, the second clock rate being greater than the first clock rate.

Suitably, the second core being idle or off in the first mode.

Suitably, the second core operating in the first mode when the integrated circuit carries out a task in the first range of tasks and the second core operating in the second mode when the integrated circuit carries out a task in the first range of tasks and, in parallel, a task in the second range of tasks.

Suitably, when the second core operates in the second mode, the integrated circuit being capable of carrying out a task in the first range of tasks and a task in the second range of tasks at the same time.

Suitably, the first range of tasks having a first range of performance parameters and the second range of tasks having a second range of performance parameters, the performance parameter being a workload, the workloads of the second range of tasks being greater than the workloads of the first range of tasks.

Suitably, the mode of operation of the second core being dependent on instructions sent by the first core.

Suitably, the clock rate of the first core being between 32 kHz and 16 MHz.

Suitably, the clock rate of the second core being between 8 MHz and 64 MHz.

Suitably, the first clock rate being variable between a first range of clock rates.

Suitably, the first clock rate being selected from the first range of clock rates in dependence on a performance parameter of a task, the task being comprised in the first range of tasks.

Suitably, the first range of tasks having a first range of performance parameters and the second range of tasks having a second range of performance parameters, the first core being capable of carrying out a task in the first range of tasks and, at the same time, the second core being capable of carrying out a task in the second range of tasks, the first clock rate being dependent on the performance parameter of the said task being carried out.

Suitably, the clock rate of the first core being variable between 32 kHz and 16 MHz.

Suitably, the clock rate of the second core being between 8 MHz and 64 MHz.

Suitably, the IC further comprises a core controller for controlling the mode of the second core, the core controller determining a performance parameter and causing the second core to operate in the first mode when the performance parameter is in a first performance range and causing the second core to operate in the second mode when the performance parameter is in a second range.

Suitably, the second core having a third clock rate in the first mode, the third clock rate being less than or equal to the first clock rate.

According to a second aspect of the disclosure there is provided a device comprising the integrated circuit described above, the first range of tasks including scanning for a user input at said device and scanning for data sent to said device.

According to a third aspect of the disclosure there is provided a Bluetooth Low energy chip comprising the integrated circuit described above.

According to a fourth aspect of the disclosure there is provided a method for processing at an integrated circuit, the integrated circuit comprising a first core circuit and a second core circuit, the second core circuit being configured to operate in a first mode and a second mode, the method comprising: at the first core circuit, operating at a first clock rate for carrying out a first range of tasks; and at the second core circuit, operating at a second clock rate for carrying out a second range of tasks in the second mode when the first core circuit carries out the first range of tasks, the second clock rate being greater than the first clock rate.

Suitably, the method further comprises: determining a performance parameter for a first task of the first range of tasks and a performance parameter for a second task of the second range of tasks; if the performance parameter of the first task is below a performance threshold and the performance parameter of the second task is above the performance threshold, then: at the first core circuit, carrying out the first task; and at the second core circuit, carrying out the second task, the first and second cores carrying out their respective tasks at the same time.

BRIEF DESCRIPTION OF THE DRAWINGS

The following disclosure will now be described by way of example with reference to the accompanying drawings. In the drawings.

DETAILED DESCRIPTION

Examples of the type of devices that require low power consumption may be wireless keyboards and mice, wireless microphones, and other wireless devices. Such devices may wirelessly communicate with other devices using a communications protocol. An example of a suitable communications protocol that provides for low power consumption may be Bluetooth Low Energy (BLE), which is defined in the Bluetooth Specification v4.0. These devices may be operable using a chip that comprises BLE circuitry (that enables BLE communication) and an IC, for example, a processor that enables the chip to carry out certain tasks. In some situations, the resulting output from processing these tasks may be communicated wirelessly via the BLE circuitry. In some other situations, the processor may perform certain tasks that do not require the resulting data to be communicated via the BLE circuitry.

Figure 1:
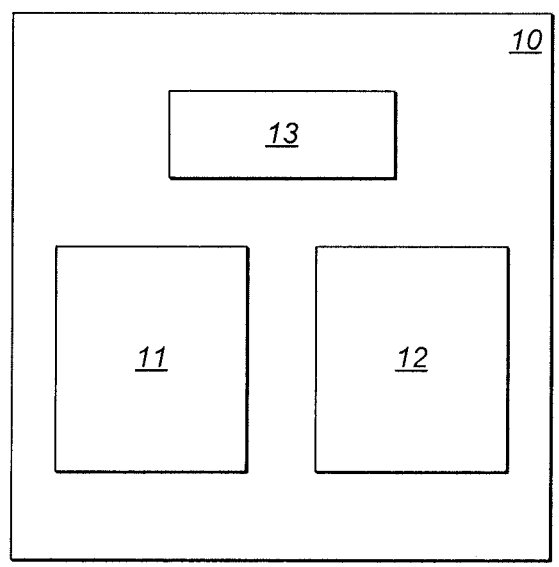
FIG. 1 illustrates an IC.

FIG. 1 shows an IC 10 that includes a first core 11 and a second core 12. The IC 10 may comprise a memory block 13 that can be shared between the first core 11 and the second core 12. The cores 11 and 12 may be independently and dynamically operable and asymmetric. The cores 11 and 12 can process data to carry out tasks or execute instructions. For example, one such task may be a background task such as scanning for an input (e.g. for a keyboard, scanning for a key to be pressed by a user). Another task may be an active task such as acquiring data to be sent via BLE (e.g. for a keyboard, acquiring and encoding the data resulting from keys being pressed by a user). The tasks required to be performed by the IC may vary in the amount of processing power required to execute each task. For example, the scanning for an input may require less processing power than the encoding of data to be sent via BLE.

The first core 11 may have less processing power than the second core 12. For example, the clock rate of the first core 11 may be less than the clock rate of the second core 12. This allows the first core 11 to operate with a lower power consumption than the second core 12. For tasks that require low processing power, the first core 11 may be utilised, while the second core 12 is idled by turning it off. The second core 12 may be idled by turning off the power rail of the core, internally gating the power rail, back biasing the substrate of the core, gating the clock of the core, or the like. The second core 12 may have a separate power and clock domain, so that it is independently controllable from the first core 11. This allows the second core 12 to be completely powered off when it is not in use, which helps to save power. This provides a power saving as the higher power second core 12 is not constantly running and only running when required. A power saving can be achieved as the second core 12 may not process tasks that require low processing power. These low processing power tasks are processed by the first core 11, which uses less power than the second core 12.

While a chip or device comprising the IC is switched on, the first core 11 may constantly be on and running. The IC may be required to perform certain tasks, and each task may require a different amount of processing power. The first core 11 may be capable of providing processing power up to a certain performance threshold. Any tasks received by the IC below the performance threshold may be carried out by the first core 11 alone, allowing the second core 12 to be idled. If the IC receives a task above the performance threshold, the second core 12 is turned on and the task is carried out by the second core 12. Once that task is complete, the second core 12 may be idled again. The first core 11 may have its own memory space and it thus not reliant on the second core 12 being powered for it to run.

Irrespective of the status of the second core 12 (either switched on or switched off), the first core 11 remains on. This provides a number of advantages, such as:

Parallel processing. By having both cores 11 and 12 operating at the same time, two processing tasks can be carried out at the same time. The first core 11 is able to carry out any task below the performance threshold while the second core 12 is able to carry out tasks above the performance threshold. This provides the IC with a greater total processing capability and allows different types of tasks of different workloads to be carried out in parallel.

Shorter switching delay. The first core 11 is not turned off when the second core 12 is active, thus when the second core 12 is turned off, there is no need to turn on the first core 11 as it is already on. Powering up takes time as voltage rails and clocks of a core that is being switched on takes some time to stabilise. Thus by leaving the first core 11 on, the delay in switching processing from the second core to the first core is reduced.

Power saving. If the first core 11 was switched off when the second core 12 is on and the workload of some tasks vary slightly above and below the performance threshold, then this would result in poor performance and increased power consumption due to the frequent switching between the cores. By allowing the first core 11 to remain on, the first core 11 is not frequently switched on and off, thereby reducing the effects of poor performance and increased power consumption.

The IC may determine the workload associated with each task and if that workload is above a certain performance threshold, the IC can cause the second core 12 to be switched on. For example, the first core 11 can collate data (such a task having a low workload) and when that data is required to be processed and sent via BLE (such a task having a high workload), the first core 11 can wake up the second core 12. The first core 11 can continue to collate the data for processing at the second core 12 (i.e. the first core 11 and the second core 12 can carry out their respective tasks at the same time). The first and second cores 11 and 12 can have a section of shared memory 13 to enable data to be transferred between the cores. One way the workload can be defined is by the amount of data that is required to be processed by a certain amount of time.

The IC may cause the second core to be turned on depending on an operating mode of a device comprising the IC. For example, the device may be in a "sleep" or "background" mode in which there is a low workload. When the device changes to an "active" mode in which there is a higher workload, the second core 12 may be "woken up" to process the higher workload. In an example, a wireless keyboard in a sleep mode (i.e. not being used) waits for a user to press a key by scanning the keys in the background. This key scanning requires a low workload and can be carried out by the first core 11. The key scanning processed by the first core 11 can detect when a user presses a key. This can then cause the keyboard to change to an "active" mode and cause the second core 12 to be turned on. The second core 12 can then acquire and process the data arising from the keyboard being used (which has a higher workload than key scanning). Thus, the turning on of the second core 12 can be dependent on the processing carried out by the first core 11.

The first core 11 may have a low clock rate. The clock rate of the first core 11 may be a rate between 32 kHz and 16 MHz. Preferably, the rate is 32 kHz. This allows the first core to be very power efficient and provides enough processing power for certain low workload tasks (for example, such as, scanning for data input).

The clock rate of the first core 11 may be fixed (i.e. non-adjustable) or variable (i.e. adjustable). The first core 11 can be run at different clock speeds to enable it to be at its lowest power for the task in hand. Switching the clock speed of the first core 11 can be done on the fly and does not corrupt the clock of the IC. A first core 11 with a variable clock rate may be capable of adjusting its clock rate between 32 kHz and 16 MHz. By providing an adjustable clock rate, the first core 11 is capable of processing tasks with a greater range of workloads. For example, if a task with a workload just above the performance threshold is to be processed in an IC with a non-adjustable clock rate, the second core 12 would need to be switched on. However, if the clock rate is adjustable, then the clock rate of the first core 11 may be adjusted such that the first core is capable of processing that workload without having to turn on the second core 12. This can help negate the frequent switching problems mentioned above. Furthermore, the variable rate clock rate of the first core 11 allows the IC to select a clock rate that enables the processing to be done on the first core at its lowest power.

The second core 12 may have a high clock rate. This clock rate may be a rate between 8 MHz and 64 MHz. This higher clock rate allows the IC to process data more quickly.

The IC may comprise a controller which determines when to turn the second core 12 on and off. The controller can determine the workload of the IC and if that workload is above a certain performance threshold, then it can turn the second core 12 on. If that workload falls below the performance threshold, the controller can turn the second core off.

Rather than idling the second core 12 when there are no high workload tasks (i.e. tasks above the performance threshold), the clock rate of the second core 12 may be lowered. This can help save power and partially negate some of the above-mentioned issues regarding frequently turning the core on and off. The clock rate may be lowered to the same rate as the first core 11. This can allow parallel processing of low workload tasks, which can be useful in dual functionality devices (e.g. scanning for inputs from a keyboard with an integrated mouse). The clock rate of the second core may be lowered to be less than that of the first core, thus bringing added power saving benefits.

Figure 2:
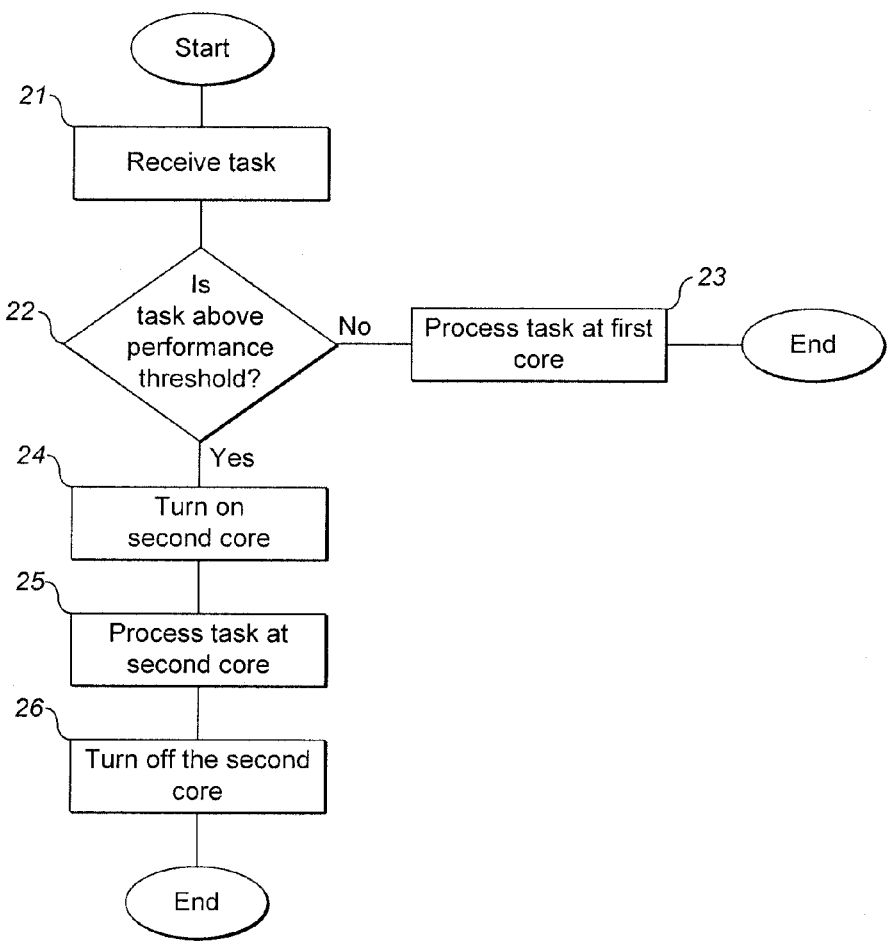
FIG. 2 shows an example of a process carried out by the IC.

FIG. 2 diagrammatically shows an exemplary process that can be carried out by the IC for processing a task.

At step 21, a task is received. At step 22, it is determined if that task is above a performance threshold. If the task is not above the performance threshold, the process moves on to step 23. If the task is above the performance threshold, the process moves on to step 24. At step 23, the first core processes the task and then the process ends. At step 24, the second core is turned on. At step 25, the second core processes the task. At step 26, when the processing of the task has been completed, the second core is turned off and then the process ends. During steps 24 to 26, the IC may receive another task that is not above the performance threshold and performs steps 21 to 23 for the other task at the same time as steps 24 to 27.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the spirit and scope of the invention.

What is claimed is:

1. A Bluetooth low energy chip comprising:
   a first core circuit configured to operate at a first clock rate for carrying out a first range of tasks; and
   a second core circuit configured to operate in a first mode and a second mode, the second core circuit being configured to operate at a second clock rate for carrying out a second range of tasks in the second mode and being configured to operate in the second mode when the first core circuit carries out the first range of tasks, the second clock rate being greater than the first clock rate.

2. The Bluetooth low energy chip of claim 1, the second core being idle or off in the first mode.

3. The Bluetooth low energy chip of claim 1, the second core operating in the first mode when the integrated circuit carries out a task in the first range of tasks and the second core operating in the second mode when the integrated circuit carries out a task in the first range of tasks and, in parallel, a task in the second range of tasks.

4. The Bluetooth low energy chip of claim 1, when the second core operates in the second mode, the integrated circuit being capable of carrying out a task in the first range of tasks and a task in the second range of tasks at the same time.

5. The Bluetooth low energy chip of claim 1, the first range of tasks having a first range of performance parameters and the second range of tasks having a second range of performance parameters, the performance parameter being a workload, the workloads of the second range of tasks being greater than the workloads of the first range of tasks.

6. The Bluetooth low energy chip of claim 1, the mode of operation of the second core being dependent on instructions sent by the first core.

7. The Bluetooth low energy chip of claim 1, the clock rate of the first core being between 32 kHz and 16 MHz.

8. The Bluetooth low energy chip of claim 1, the clock rate of the second core being between 8 MHz and 64 MHz.

9. The Bluetooth low energy chip of claim 1, the first clock rate being variable between a first range of clock rates.

10. The Bluetooth low energy chip of claim 9, the first clock rate being selected from the first range of clock rates in dependence on a performance parameter of a task, the task being comprised in the first range of tasks.

11. The Bluetooth low energy chip of claim 10, the first range of tasks having a first range of performance parameters and the second range of tasks having a second range of performance parameters, the first core being capable of carrying out a task in the first range of tasks and, at the same time, the second core being capable of carrying out a task in the second range of tasks, the first clock rate being dependent on the performance parameter of the said task being carried out.

12. The Bluetooth low energy chip of claim 11, the clock rate of the first core being variable between 32 kHz and 16 MHz.

13. The Bluetooth low energy chip of claim 11, the clock rate of the second core being between 8 MHz and 64 MHz.

14. The Bluetooth low energy chip of claim 1, further comprising a core controller for controlling the mode of the second core, the core controller determining a performance parameter and causing the second core to operate in the first mode when the performance parameter is in a first performance range and causing the second core to operate in the second mode when the performance parameter is in a second range.

15. The Bluetooth low energy chip of claim 1, the second core having a third clock rate in the first mode, the third clock rate being less than or equal to the first clock rate.

16. A device comprising the Bluetooth low energy chip of claim 1, the first range of tasks including scanning for a user input at said device and scanning for data sent to said device.

17. A method for processing at an Bluetooth low energy chip, the Bluetooth low energy chip comprising a first core circuit and a second core circuit, the second core circuit being configured to operate in a first mode and a second mode, the method comprising:
   at the first core circuit, operating at a first clock rate for carrying out a first range of tasks; and
   at the second core circuit, operating at a second clock rate for carrying out a second range of tasks in the second mode when the first core circuit carries out the first range of tasks, the second clock rate being greater than the first clock rate.

18. The method of claim 17, further comprising:
   determining a performance parameter for a first task of the first range of tasks and a performance parameter for a second task of the second range of tasks;
   if the performance parameter of the first task is below a performance threshold and the performance parameter of the second task is above the performance threshold, then:
   at the first core circuit, carrying out the first task; and
   at the second core circuit, carrying out the second task, the first and second cores carrying out their respective tasks at the same time.

* * * * *

UNITED STATES PATENT AND TRADEMARK OFFICE
CERTIFICATE OF CORRECTION

PATENT NO.        : 8,766,710 B1
APPLICATION NO.   : 13/572592
DATED             : July 1, 2014
INVENTOR(S)       : Finch et al.

Page 1 of 1

It is certified that error appears in the above-identified patent and that said Letters Patent is hereby corrected as shown below:

Title Page Item (56), under "OTHER PUBLICATIONS", in Column 2, Line 2, delete "Coporation," and insert -- Corporation, --, therefor.

Signed and Sealed this
Sixteenth Day of September, 2014

Michelle K. Lee
*Deputy Director of the United States Patent and Trademark Office*